(12) United States Patent
Lee et al.

(10) Patent No.: US 12,362,972 B2
(45) Date of Patent: Jul. 15, 2025

(54) APPARATUS, METHOD AND RECORDING MEDIUM FOR RECEIVING FOUR-LEVEL PULSE AMPLITUDE MODULATION (PAM-4) SIGNAL

(71) Applicant: Foundation for Research and Business, Seoul National University of Science and Technology, Seoul (KR)

(72) Inventors: Won Young Lee, Seoul (KR); Young Min Lee, Seoul (KR)

(73) Assignee: Foundation for Research and Business, Seoul National University of Science and Technology, Seoul (KR)

( * ) Notice: Subject to any disclaimer, the term of this patent is extended or adjusted under 35 U.S.C. 154(b) by 30 days.

(21) Appl. No.: 18/419,570

(22) Filed: Jan. 23, 2024

(65) Prior Publication Data
US 2024/0396771 A1    Nov. 28, 2024

(30) Foreign Application Priority Data
May 25, 2023    (KR) .......................... 10-2023-0067336

(51) Int. Cl.
*H04L 25/49* (2006.01)
*H03M 5/20* (2006.01)

(52) U.S. Cl.
CPC .......... *H04L 25/4917* (2013.01); *H03M 5/20* (2013.01)

(58) Field of Classification Search
CPC .. H04L 25/4917; H04L 25/0272; H03M 5/20; H03M 7/165
See application file for complete search history.

(56) References Cited

U.S. PATENT DOCUMENTS

| | | | |
|---|---|---|---|
| 7,433,401 | B1 | 10/2008 | Roo |
| 8,750,406 | B2 * | 6/2014 | Pan ..................... H04L 25/4917 375/287 |
| 10,348,536 | B2 | 7/2019 | Choi et al. |
| 2021/0313937 | A1 * | 10/2021 | Kim ..................... H04L 25/0272 |
| 2022/0407749 | A1 * | 12/2022 | Hossain ............ H04L 25/03057 |
| 2024/0259007 | A1 * | 8/2024 | Chae ..................... G11C 7/1084 |

FOREIGN PATENT DOCUMENTS

| | | |
|---|---|---|
| KR | 20060123926 A | 12/2006 |
| KR | 100818796 B1 | 4/2008 |
| KR | 100897770 B1 | 5/2009 |
| KR | 20120105137 A | 9/2012 |
| KR | 101490999 B1 | 2/2015 |
| KR | 20220050663 A | 4/2022 |
| KR | 20220110016 A | 8/2022 |
| KR | 102478277 B1 | 12/2022 |

* cited by examiner

*Primary Examiner* — Dac V Ha
(74) *Attorney, Agent, or Firm* — NKL Law; Jae Youn Kim

(57) ABSTRACT

Proposed is a device for receiving a four-level pulse amplitude modulation (PAM-4) signal, which includes a first comparator for comparing a received PAM-4 signal with a predetermined threshold voltage to output a most significant bit (MSB) signal; and a second comparator for comparing the differential signal difference between the positive signal and negative signal of the received PAM-4 signal with a reference voltage to output a least significant bit (LSB) signal.

13 Claims, 9 Drawing Sheets

APPARATUS, METHOD AND RECORDING MEDIUM FOR RECEIVING FOUR-LEVEL PULSE AMPLITUDE MODULATION (PAM-4) SIGNAL

TECHNICAL FIELD

The present invention relates to an apparatus, method, and recording medium for receiving a four-level pulse amplitude modulation (PAM-4) signal.

BACKGROUND OF THE INVENTION

As bandwidth demand from data centers and information and communications companies increases, optical interface standards capable of operating up to 56 Gbytes/sec per channel are being actively discussed. In order to implement this high-speed optical interface, a highly efficient multi-level signal modulation technique such as pulse amplitude modulation is needed, rather than the simple modulation of a conventional Non Return to Zero (NRZ) technique. That is, in order to improve the performance of the overall transmission system, the communication speed between internal chips must be increased. As such, techniques such as PAM with multi-level amplitude are used to meet high transmission capacity in interconnection and increase channel efficiency.

A PAM-4 signal receiver refers to a device that converts a PAM-4 signal into a digital signal. A typical PAM-4 signal receiver uses three comparators to recognize a thermometer code and then converts it to binary code or gray code using a decoder. In this case, three comparators are needed to identify the two bits, and a decoder is additionally needed. Since this PAM-4 signal receiver is a high-speed operation circuit, there is a problem in that the power consumption of the comparators and decoder is large.

Accordingly, research on PAM-4 signal receiver that can minimize the power consumption is necessary.

SUMMARY OF THE INVENTION

The present invention has been created to solve the above problem, and an object of the present invention is to provide a device, method, and recording medium for receiving PAM-4 signals.

A device for receiving a four-level pulse amplitude modulation (PAM-4) signal according to an embodiment of the present invention for achieving the above object may comprise a first comparator for comparing the received PAM-4 signal with a predetermined threshold voltage to output a most significant bit (MSB) signal, and a second comparator for comparing the differential signal difference between a positive signal and a negative signal of the received PAM-4 signal with a reference voltage to output a least significant bit (LSB) signal.

A method of receiving a four-level pulse amplitude modulation (PAM-4) signal according to an embodiment of the present invention for achieving the above object may comprise the steps of comparing, by a first comparator, the received PAM-4 signal with a predetermined threshold voltage to output a most significant bit (MSB) signal, and comparing, by a second comparator, a differential signal difference between a positive signal and a negative signal of the received PAM-4 signal with a reference voltage to output a least significant bit (LSB) signal.

According to one aspect of the present invention described above, the present invention reduces the number of comparators of the PAM-4 signal receiving device from 3 to 2 and does not use an additional decoder, thereby enabling low-power design of the PAM-4 signal receiving device. It is effective and has the advantage of being able to be used in mobile devices that operate with relatively small batteries.

DETAILED DESCRIPTION OF THE INVENTION

Figure 1:
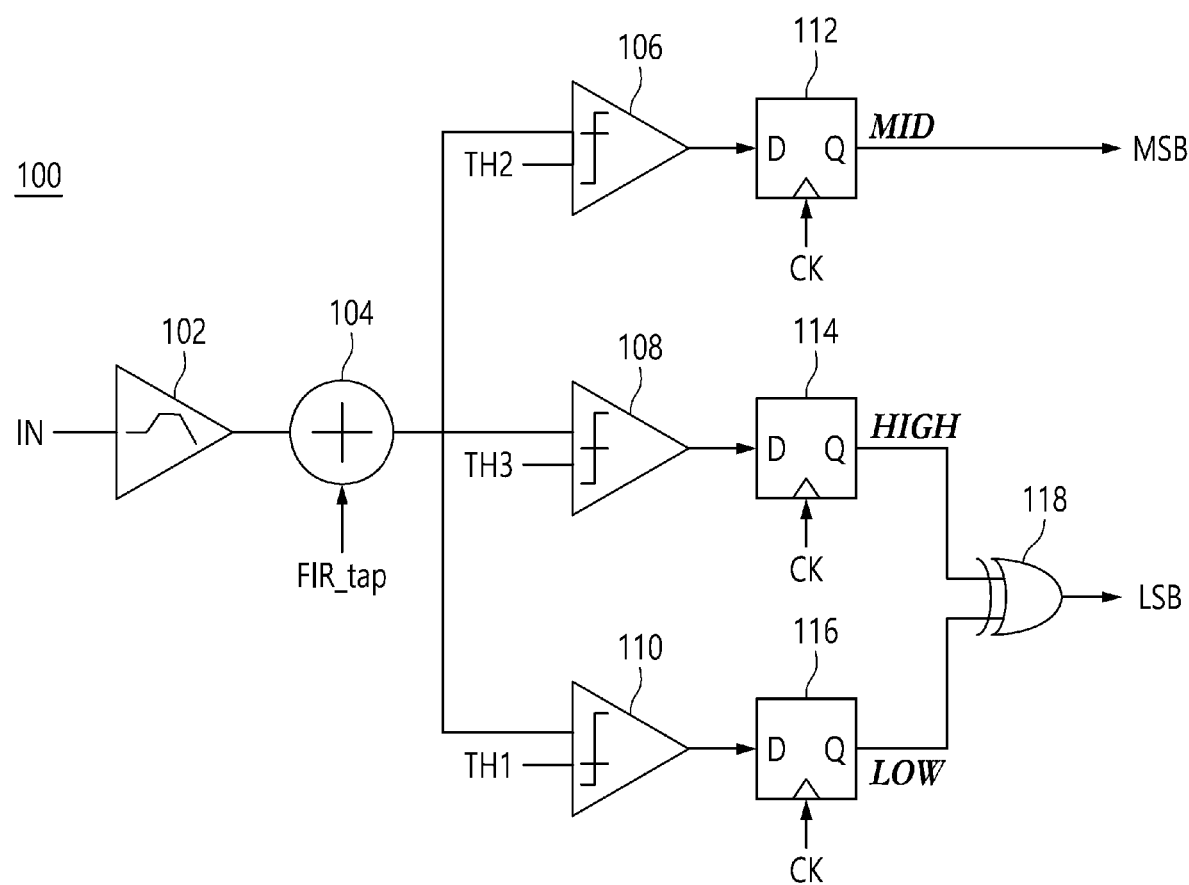
FIG. 1 is a device diagram showing the internal blocks of a typical PAM-4 signal receiver.

The detailed description of the present invention described below refers to the accompanying drawings which show by way of example specific embodiments in which the present invention may be practiced. These embodiments are described in sufficient detail to enable those skilled in the art to practice the invention. It should be understood that the various embodiments of the present invention are different from one another but are not necessarily mutually exclusive. For example, specific shapes, structures and features described herein may be implemented in other embodiment without departing from the spirit and scope of the invention. Additionally, it should be understood that the location or arrangement of individual components within each disclosed embodiment may be changed without departing from the spirit and scope of the invention. Accordingly, the detailed description that will be described later is not intended to be taken in a limiting sense, and the scope of the invention is limited only by the appended claims, together with all equivalents to what those claims assert, if properly described. Similar reference numerals in the drawings refer to identical or similar functions across various aspects.

The components according to the present invention are components defined by functional division rather than physical division, and can be defined by the functions that each component performs. Each component may be implemented as hardware or program code and processing units that perform each function, and the functions of two or more components may be included and implemented in one component. Therefore, it should be noted that the names given to the components in the following embodiments are not intended to physically divide respective components, but are given to imply the representative function performed by respective components, and that the technical idea of the present invention is not limited to the names of the components.

Hereinafter, preferred embodiments of the present invention will be described in more detail with reference to the drawings.

FIG. 1 is a device diagram showing the internal blocks of a typical PAM-4 signal receiver.

Referring to FIG. 1, the typical PAM-4 signal receiver 100 shown includes a continuous time linear equalizer (CTLE) 102 and a summer 104 of a digital feedback equalizer (DFE), first to third comparators 106, 108 and 110, first to third D-Flip Flops (D-FFs) 112, 114, 116, and exclusive OR (XOR) gate 118.

Upon receiving the PAM-4 signal, the CTLE 102 compensates for the distortion of the PAM-4 signal and then outputs it to the summer 104 of the DFE. The summer 104 of the DFE removes an inter-symbol interference (ISI) from the received PAM-4 signal and then outputs it the first to third comparators 106, 108, and 110, respectively.

Upon receiving the PAM-4 signal, the first comparator 106 compares the received PAM-4 signal with a second threshold voltage signal TH2 and outputs one bit value to a first D-FF 112, and the first D-FF 112 outputs a MID signal corresponding to the second bit of the thermometer signal based on the received one bit value. Here, the MID signal becomes the most significant bit (MSB) signal of the gray code without a separate conversion process.

Upon receiving the PAM-4 signal, the second comparator 108 compares it with a third threshold voltage signal TH3 and outputs one bit value to a second D-FF 114. The second D-FF (114) outputs a HIGH signal corresponding to the highest bit of the thermometer signal to a XOR gate 118. In addition, upon receiving the PAM-4 signal, a third comparator 110 compares it with the first threshold voltage signal TH1 and outputs one bit value to a third D-FF 116. The third D-FF 116 outputs a LOW signal corresponding to the least significant bit (LSB) signal of the thermometer signal to the XOR gate 118.

The XOR gate 118 calculates the exclusive OR of the received HIGH signal and the LOW signal and outputs a least significant bit (LSB) signal.

Figure 2:
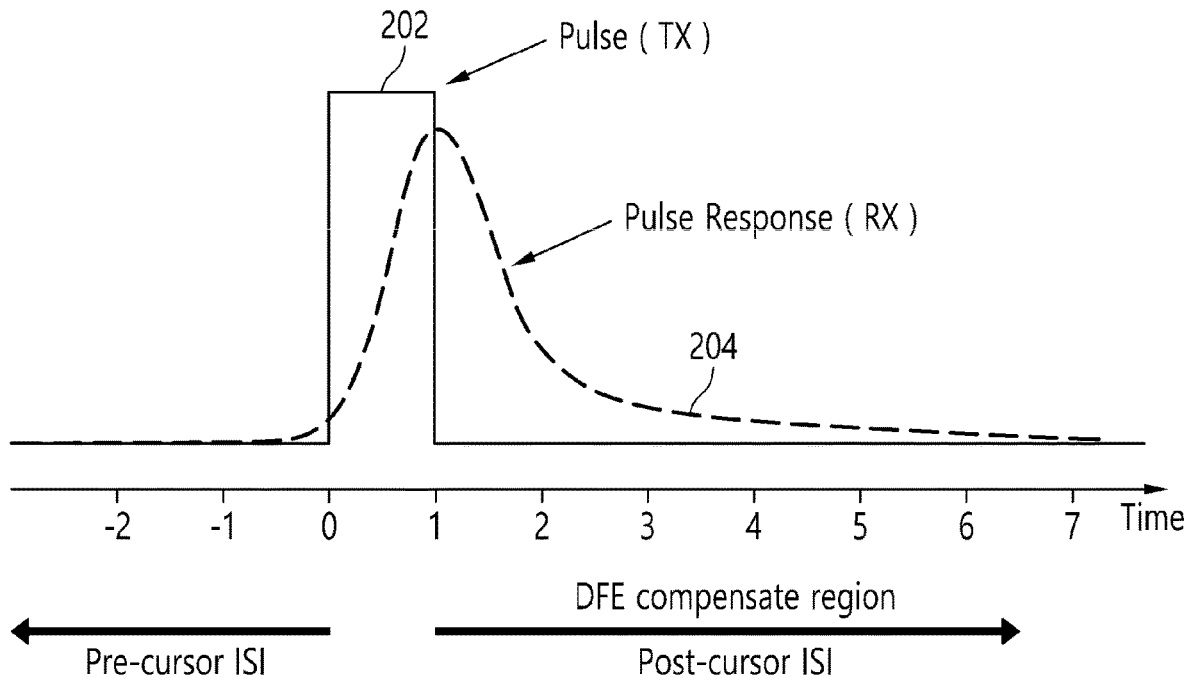
FIG. 2 is a graph showing an example of pulse response due to the influence of the channel.

FIG. 2 is a graph showing an example of pulse response due to the influence of the channel.

Referring to FIG. 2, the pulse transmitted by the TX can be represented as reference numeral 202 on the time axis, and the pulse response received by the RX can be represented as reference numeral 204 on the time axis. As can be seen from the graph shown, the ISI occurring in the previous bit affects the pulse response of the next bit.

At this time, the DFE can remove the ISI by removing the post-cursor in which a signal that occurs later in time affects the preceding signal. The process of removing the ISI can be expressed as Equation 1 below.

$$I'_k = a_0 v_k - \sum_{j=1}^{N} a_j I_{k-j},$$ [Equation 1]

where $I_k'$ represents the kth detected information symbol with ISI removed, $v_k$ represents the kth input signal, $a_0$ represents the input signal gain, $a_j$ represents the tap coefficients of the feedback filter, and $I_{k-1}, \ldots, I_{k-N}$ represents the previously detected information symbol. As such, the ISI can be removed by removing the part corresponding to $\Sigma a_j I_{k-j}$ from the input signal.

Figure 3:
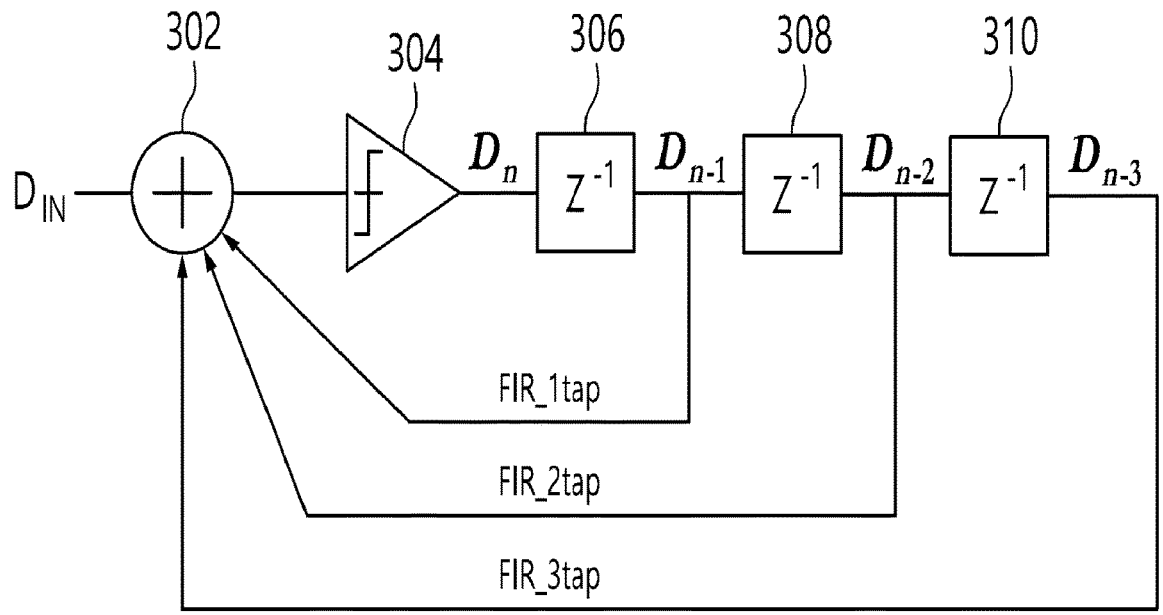
FIG. 3 is a diagram showing an example of a DFE operation in NRZ technique.

FIG. 3 is a diagram showing an example of a DFE operation in NRZ technique.

Referring to FIG. 3, the input signal $D_{IN}$ passes through the summer 302 and the comparator 304 of the DFE, and the $D_n$ outputted from the comparator 304 is inputted to the first D-FF 306.

The first D-FF 306 receives $D_n$ and outputs $D_{n-1}$, the second D-FF 308 receives $D_{n-1}$ and outputs $D_{n-2}$, and the third D-FF 310 receives $D_{n-2}$ and outputs $D_{n-3}$. The output of each of the first to third D-FFs 306, 308 and 310 is inputted to the summer 302 of the DFE as a Filter Impulse Response (FIR)-tap.

The n−1 signal is a signal received before 1 unit interval (1 UI), where 1 UI represents 1/data rate. For each tap, an appropriate weight, that is, a tap weight is set to thereby compensate for loss due to the ISI. Since a signal that is closer to the current signal generates a larger ISI, the lower the number of taps, the larger the weight is set. Additionally, if the previous signal is 1, the ISI occurs in the high direction, and if the previous signal is 0, the ISI occurs in the opposite direction, so feedback must proceed in the reverse direction, and in this case, the tap weight is set to a negative value.

Figure 4A:
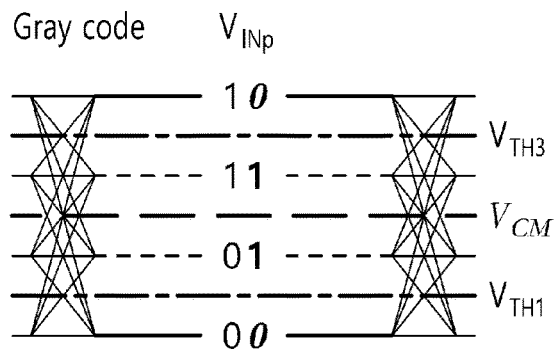
FIGS. 4(*a*) and 4(*b*) are diagrams showing an example of a PAM-4 signal to which a gray code is mapped and a PAM-4 signal to which a differential code is mapped.
Figure 4B:
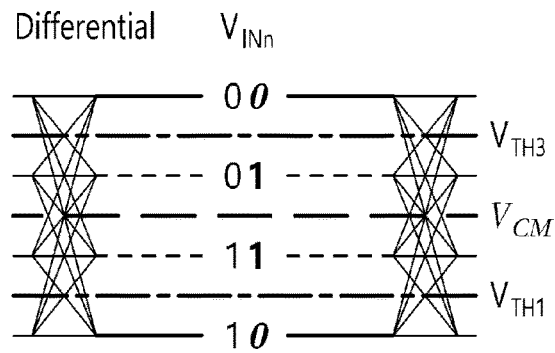

FIGS. 4(a) and 4(b) are diagrams showing an example of a PAM-4 signal to which a gray code is mapped and a PAM-4 signal to which a differential code is mapped.

Referring to FIGS. 4(a) and 4(b), FIG. 4(a) shows a PAM-4 signal to which a gray code has been mapped, and shows a positive input signal $V_{INp}$. In the PAM-4 signal to which a general binary code has been mapped, the codes corresponding to the [−3,−1,1,3] signals are [00,01,10,11], respectively, whereas in the PAM-4 signal to which the gray code has been mapped, the signals correspond to [00,01,11, 10], respectively. This gray code mapping method generates only up to one bit error during the signal transmission process and thus provides convenience in decoding.

FIG. 4(b) shows a PAM-4 signal to which a differential signal of gray code has been mapped, and shows a negative input signal $V_{INn}$.

In this case, $\Delta V$ and $V_{TH}$ can be expressed as Equation 2 below.

$$\Delta V = V_{CM} - V_{INn} = V_{INp} - V_{CM}$$ [Equation 2]

$$V_{TH} = V_{CM} - V_{TH1} = V_{TH3} - V_{CM}$$

where, $V_{INn}$ and $V_{INp}$ refer to an output of the summer of the DFE, where $V_{INp}$ represents a positive input signal, $V_{INn}$ represents a negative input signal, $V_{CM}$ represents a common mode voltage with a constant value, and $V_{TH1}$ and $V_{TH3}$, which are bias direct current (DC) voltages, represent a threshold voltage of the PAM-4 signal.

Additionally, when the amplitude of the signal is large, the LSB represents 0, and when the amplitude of the signal is small, the LSB represents 1, and therefore, by comparing the size of this amplitude with the reference amplitude, the LSB can be identified without an additional decoding process.

This LSB identification process can be expressed as Equation 3 below.

$$|V_{INp} - V_{INn}| < 2V_{TH}, LSB = 1 \quad \text{[Equation 3]}$$
$$|V_{INp} - V_{INn}| > 2V_{TH}, LSB = 0$$

That is, if the absolute value of the difference between $V_{INp}$ and $V_{INn}$ is less than $2V_{TH}$, the LSB is set to 1. If the absolute value of the difference between $V_{INp}$ and $V_{INn}$ is greater than $2V_{TH}$, the LSB is set to 0.

Figure 5:
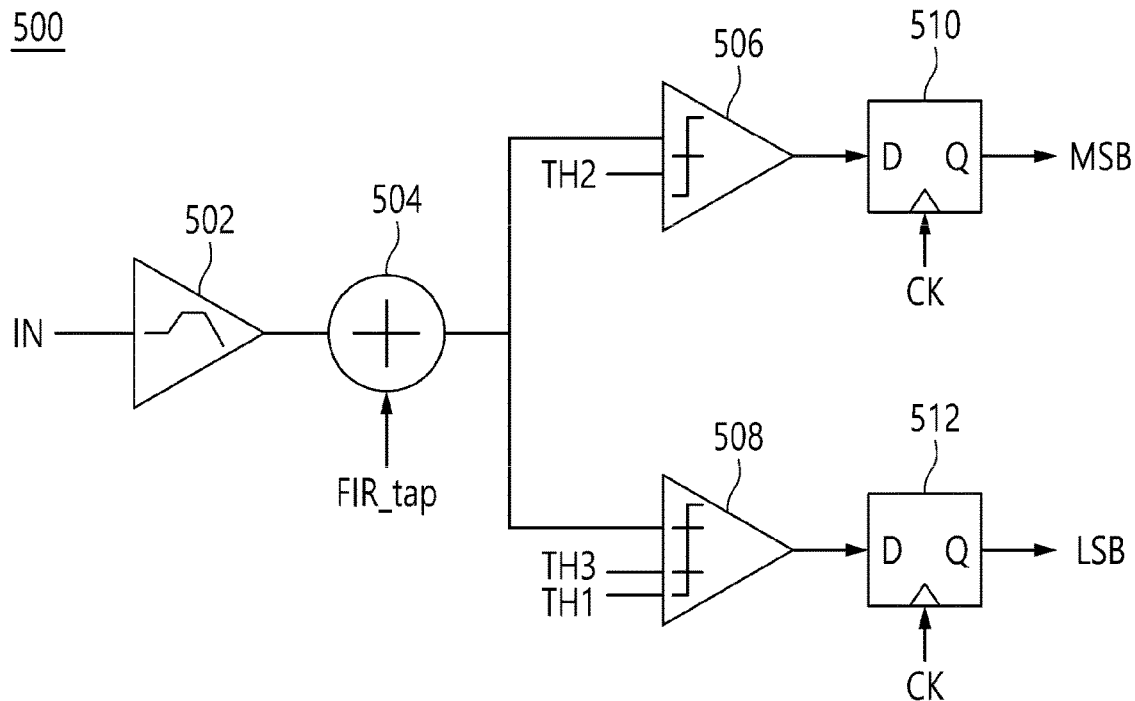
FIG. 5 is a device diagram showing the internal block of a PAM-4 signal receiver according to an embodiment of the present invention.

FIG. 5 is a device diagram showing the internal blocks of a PAM-4 signal receiver according to an embodiment of the present invention.

Referring to FIG. 5, the PAM-4 signal receiver 500 according to the illustrated embodiment of the present invention includes a CTLE 502, a DFE summer 504, a comparator 506, an LSB comparator 508, a first D-FF 510 and a second D-FF 512.

Upon receiving the PAM-4 signal, the CTLE 502 compensates for the distortion of the PAM-4 signal and then outputs it to the DFE summer 504. The DFE summer 504 removes the ISI from the received PAM-4 signal and then outputs it to the comparator 506 and the LSB comparator 508, respectively.

Upon receiving the PAM-4 signal, the comparator 506 compares it with a second threshold voltage signal TH2 and outputs one bit value to the first D-FF 510, and the first D-FF 510 outputs a MSB signal of a gray code without converting the received one bit value.

The LSB comparator 508 compares the difference between the two threshold voltage signals TH1 and TH3 with the difference between the differential input signals outputted from the summer 504 of the DFE. As explained in more detail in Equation 3, the LSB comparator 508 compares $|V_{INp}-V_{INn}|$, which is the difference between the positive signal and the negative signal outputted from the summer 504 of the DFE, with the reference voltage $2V_{TH}$ and outputs the LSB immediately without any additional operation. That is, if $|V_{Inp}-V_{INn}|$ is less than $2V_{TH}$, 1 is outputted, and if $|V_{Inp}-V_{INn}|$ is greater than $2V_{TH}$, 0 is outputted. At this time, the reference voltage $2V_{TH}$ is derived based on the threshold voltages of the PAM-4 signal as described in Equation 2.

Figure 6:
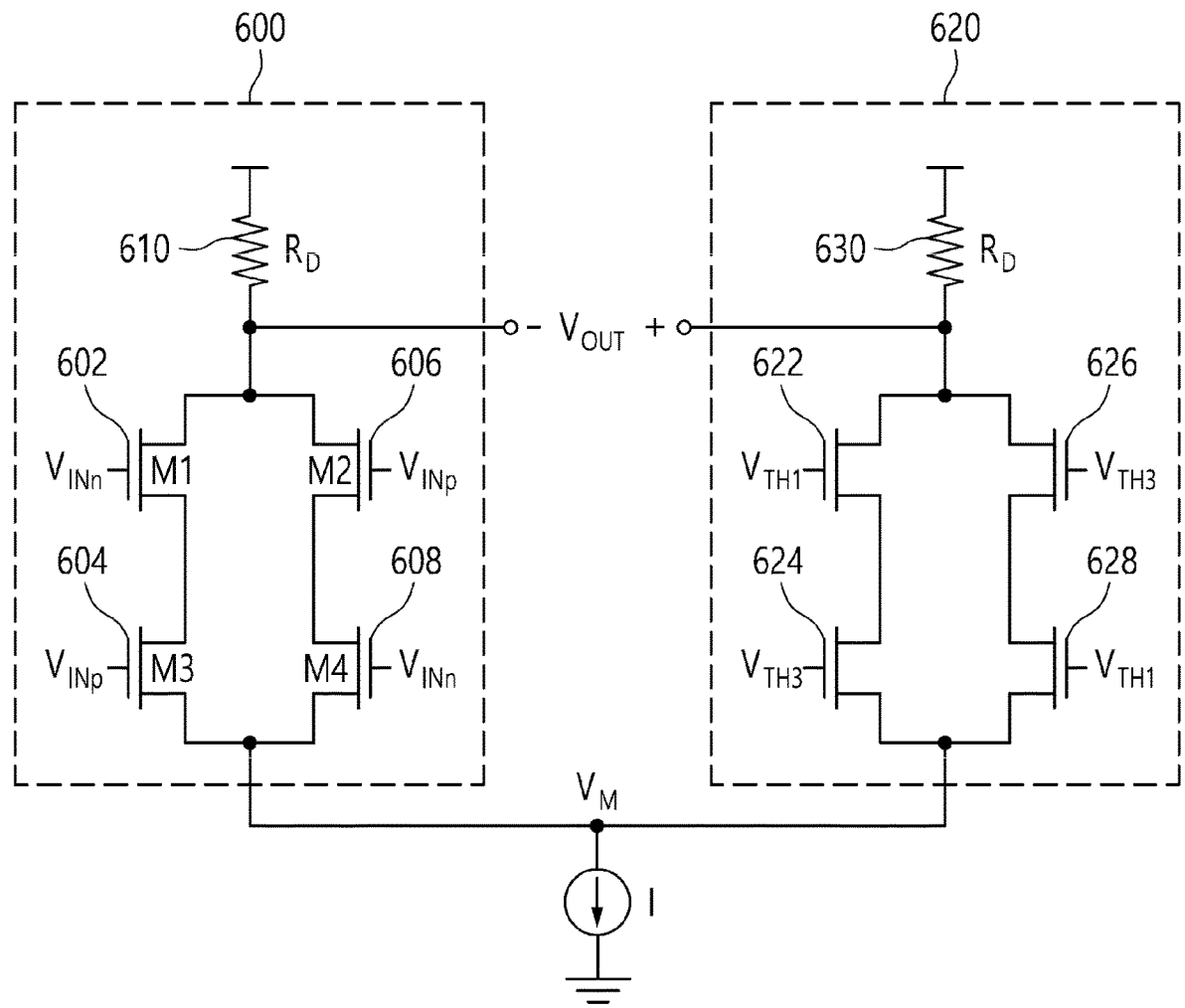
FIG. 6 is a diagram showing the internal circuit configuration of the LSB comparator of FIG. 5.

FIG. 6 is a diagram showing the internal circuit configuration of the LSB comparator of FIG. 5.

Referring to FIG. 6, the LSB comparator 508 according to an embodiment of the present invention includes a first comparison unit 600 that compares the difference between the positive signal $V_{Inp}$ and the negative signal $V_{INn}$ and a second comparison unit 620 that compares the difference the threshold voltages $V_{TH1}$ and $V_{TH3}$ of the PAM-4 signal. Here, it is assumed that each of the first and second comparison units 600 and 620 consists of one resistor, two transistors connected in series to the resistor and two transistors connected in parallel to the two transistors. Here, the comparison units 600 and 620 are not software per se, but can be one or more electric circuits or processors.

$V_{INn}$ and $V_{INp}$ are applied to the first transistor 602 and the third transistor 604 connected in series to the first resistor 610, respectively and $V_{INp}$ and $V_{INn}$ are applied to the second transistor 606 and the fourth transistor 608 connected in parallel to the first transistor 602 and the third transistor 604, respectively. Here, $V_{INp}$ and $V_{INn}$ can each be expressed as $V_{INp}=V_{CM}+\Delta V$ and $V_{INn}=V_{CM}-\Delta V$ based on Equation 2.

As such, the first comparison unit 600 adds in parallel the second and fourth transistors 606 and 608 with the input terminal order changed to the first and third transistors 602 and 604 connected in series, thereby changing the output of the signal only by the difference in the differential signal regardless of the relationship of the superiority or inferiority of the $V_{INp}$ and $V_{INn}$ signal values.

In addition, $V_{TH1}$ and $V_{TH3}$ are applied to each of the fifth transistor 622 and the sixth transistor 624 connected in series to the second resistor 630, and are applied in parallel to the fifth transistor 622 and the sixth transistor 624. $V_{TH3}$ and $V_{TH1}$ are applied to the connected the seventh transistor 626 and the eighth transistor 628, respectively. Here, each of $V_{TH1}$ and $V_{TH3}$ can be expressed as $V_{TH1}=V_{CM}-V_{TH}$, $V_{TH3}=V_{CM}+V_{TH}$ based on Equation 2. As such, the second comparison unit 620 adds in parallel the seventh and eighth transistors 626 and 628 with the input terminal order changed to the fifth and sixth transistors 622 and 624 connected in series, thereby changing the output of the signal only by the difference in the differential signal regardless of the relationship of the superiority or inferiority of the $V_{TH1}$ and $V_{TH3}$ signal values.

Finally, the LSB comparator 508 according to an embodiment of the present invention compares the difference between the output signal of the first comparison unit 600 and the output signal of the second comparison unit 620 and outputs a $V_{out}$ signal, that is, LSB.

Figure 7:
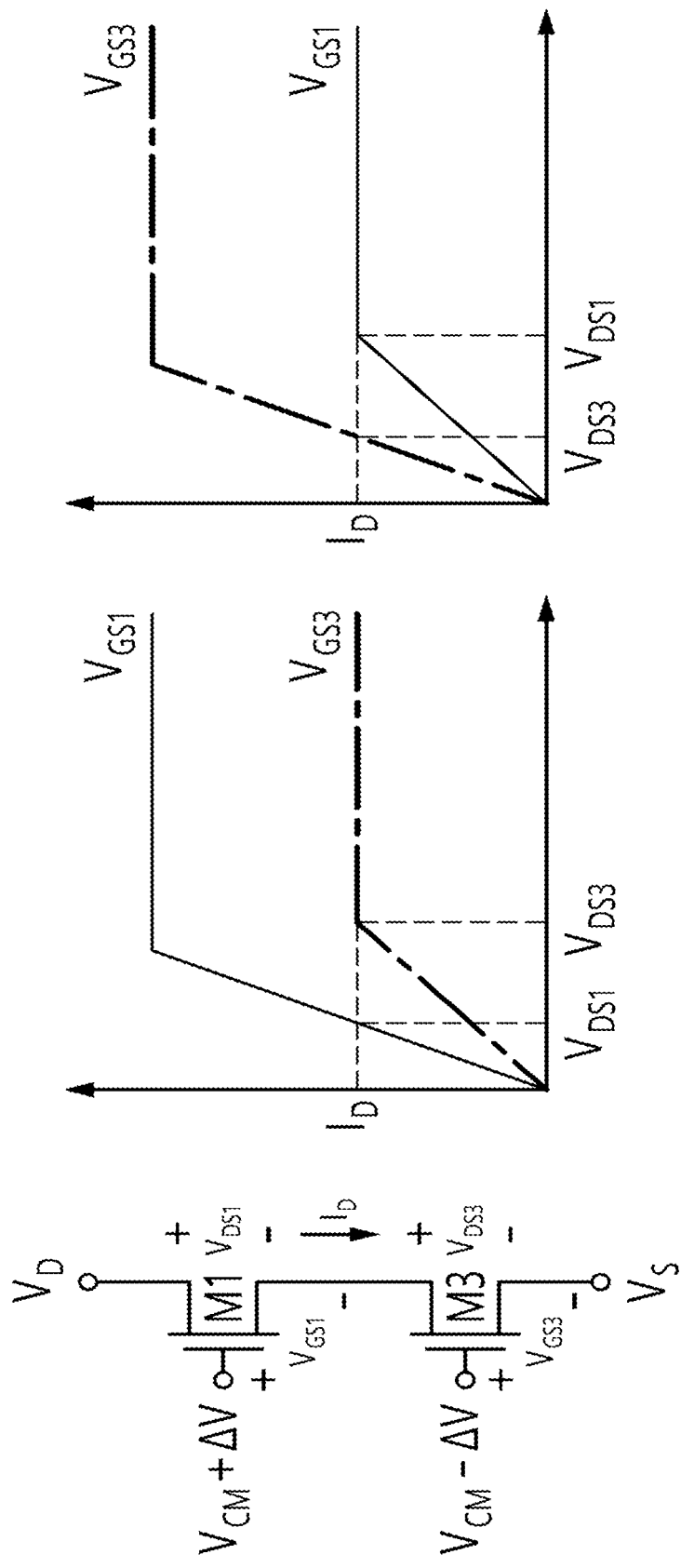
FIG. 7 is a graph showing the VGS of first and third transistors of FIG. 6.

FIG. 7 is a graph showing $V_{GS}$ of the first and third transistors of FIG. 6.

Referring to FIG. 7, assuming that the voltage between the gate and the source for the first transistor 602 is VGS1, the voltage between the drain and source is $V_{DS1}$, the voltage between the gate and source for the third transistor 604 is $V_{GS3}$, and the voltage between the drain and source thereof is $V_{DS3}$, the current $I_D$ is generated according to the smaller $V_{GS}$ and at this time, the transistor with the larger $V_{GS}$ operates as a load, as can be seen in the graph shown.

Figure 8:
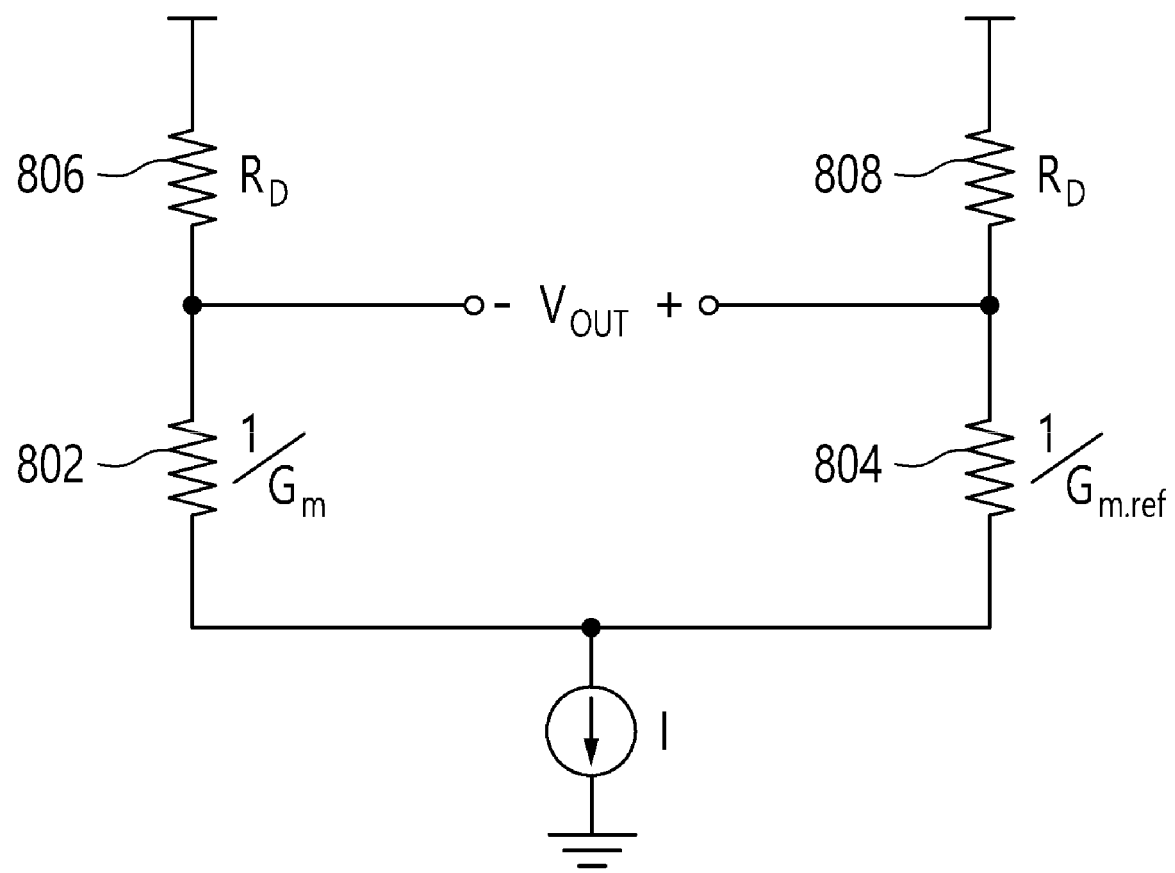
FIG. 8 is a diagram showing an equivalent circuit configuration in which transistors included in first and second comparison units of FIG. 6 are expressed as equivalent resistances.

FIG. 8 is a diagram illustrating an equivalent circuit configuration in which transistors included in the first and second comparison units of FIG. 6 are expressed as equivalent resistances.

Referring to FIG. 8, the first to fourth transistors 602, 604 606 and 608 included in the first comparison unit 600 of FIG. 6 may be replaced with a first equivalent resistor 802 to simplify the circuit, and the fifth to eighth transistors 622, 624, 626 and 628 included in the second comparison unit 620 may be replaced with a second equivalent resistor 804. Here, when the resistance values of the first and second resistors 806 and 808 are $R_D$, the resistance value of the first equivalent resistor 802 is $1/G_m$, and the resistance value of the second equivalent resistor 804 is $1/G_{m,ref}$ and a supply voltage is $V_{DD}$, the output $V_{out}$ of the LSB comparator 508 can be expressed as Equation 4 below.

$$V_{out} = \left[V_{DD} - \frac{R_D + 1/G_m}{2R_D + 1/G_{m,ref} + 1/G_m} \times IR_D\right] - \quad \text{[Equation 4]}$$
$$\left[V_{DD} - \frac{R_D + 1/G_{m,ref}}{2R_D + 1/G_{m,ref} + 1/G_m} \times IR_D\right]$$
$$= \frac{(1/G_{m,ref} - 1/G_m)IR_D}{2R_D + 1/G_{m,ref} + 1/G_m}$$

According to Equation 4, if $1/G_m$ is greater than $1/G_{m,ref}$, the LSB comparator 508 outputs 0, and if $1/G_m$ is less than $1/G_{m,ref}$, the LSB comparator 508 outputs 1.

Figure 9:
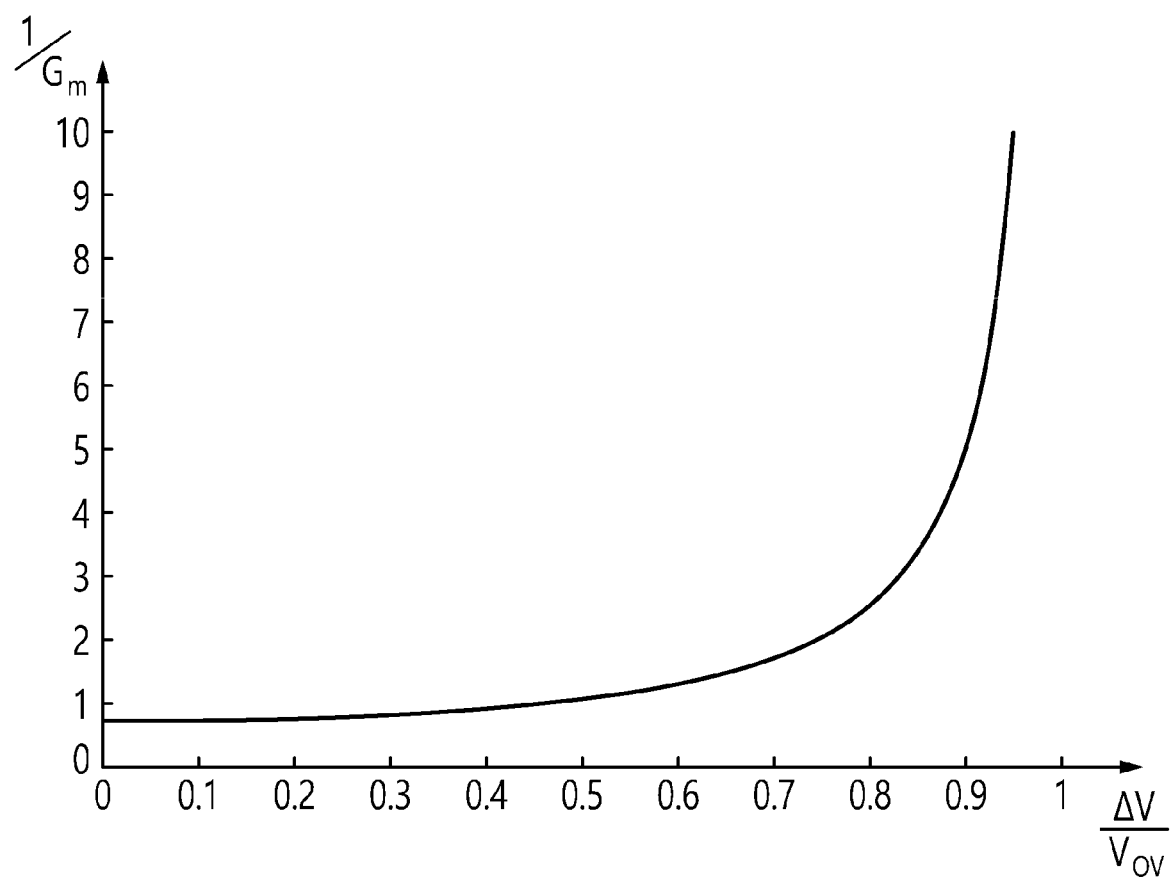
FIG. 9 is a graph showing the 1/Gm value for $\Delta V/VOV$.

FIG. 9 is a graph showing the 1/Gm value for $\Delta V/V_{OV}$.

Referring to FIG. 9, the 1/Gm value steadily increases as the $\Delta V$ value increases as can be seen in the graph shown. Therefore, if $\Delta V$ is greater than $V_{TH}$, $1/G_m$ is also greater than $1/G_{m,ref}$. Through this, the LSB comparator 508 can detect the amplitude of the differential signal and output 1 or 0. At this time, the equivalent resistance value $G_m$ considered in the graph of FIG. 9 can be expressed as Equation 5 below.

$$G_m = k_n V_{GS} = \begin{cases} k_n V_{OV}\left[\sqrt{\dfrac{2-\left(1-\dfrac{\Delta V}{V_{OV}}\right)^2}{2}} - \dfrac{\Delta V}{V_{OV}}\right] + \left[1 - \dfrac{\Delta V}{V_{OV}}\right] & \left\{\dfrac{1}{3} \leq \dfrac{\Delta V}{V_{OV}} < 1\right\} \\ k_n V_{OV}\left[\sqrt{\dfrac{2-\left(1-\dfrac{\Delta V}{V_{OV}}\right)^2}{2}} + \sqrt{\dfrac{\left(1-\dfrac{\Delta V}{V_{OV}}\right)^2}{2} - \left(\dfrac{\Delta V}{V_{OV}}\right)^2}\right] & \left\{0 < \dfrac{\Delta V}{V_{OV}} \leq \dfrac{1}{3}\right\} \end{cases}$$ [Equation 5]

where, $k_n V_{OV}$ has a constant value, and the value of $k_n V_{OV}$ is assumed to be '1' in the graph of FIG. 9. $V_{OV}$ refers to an overdrive voltage and can be expressed as $V_{OV}=V_{CM}-V_M-V_t$. Here, $V_t$ is defined as a constant value.

In the embodiment of the present invention, the LSB comparator 508 as described above is proposed, and the LSB reception method, which previously had to be implemented with two comparators and one LSB decoder (exclusive OR (XOR)) circuit, is implemented through one comparator thereby achieving a low-power design.

Meanwhile, the DFE summer used in a typical PAM-4 signal receiver maintains linearity and effectively restores the received signal by using a thermometer signal consisting of three bits of HIGH, MID and LOW. However, in the PAM-4 signal receiver according to the embodiment of the present invention, the received signal is directly outputted to the MSB and LSB, so it is difficult to properly restore the PAM-4 signal using the DFE summer of a typical PAM-4 signal receiver. Therefore, in the embodiment of the present invention, a DFE summer of a new structure suitable for the proposed PAM-4 signal receiver is proposed.

Figure 10:
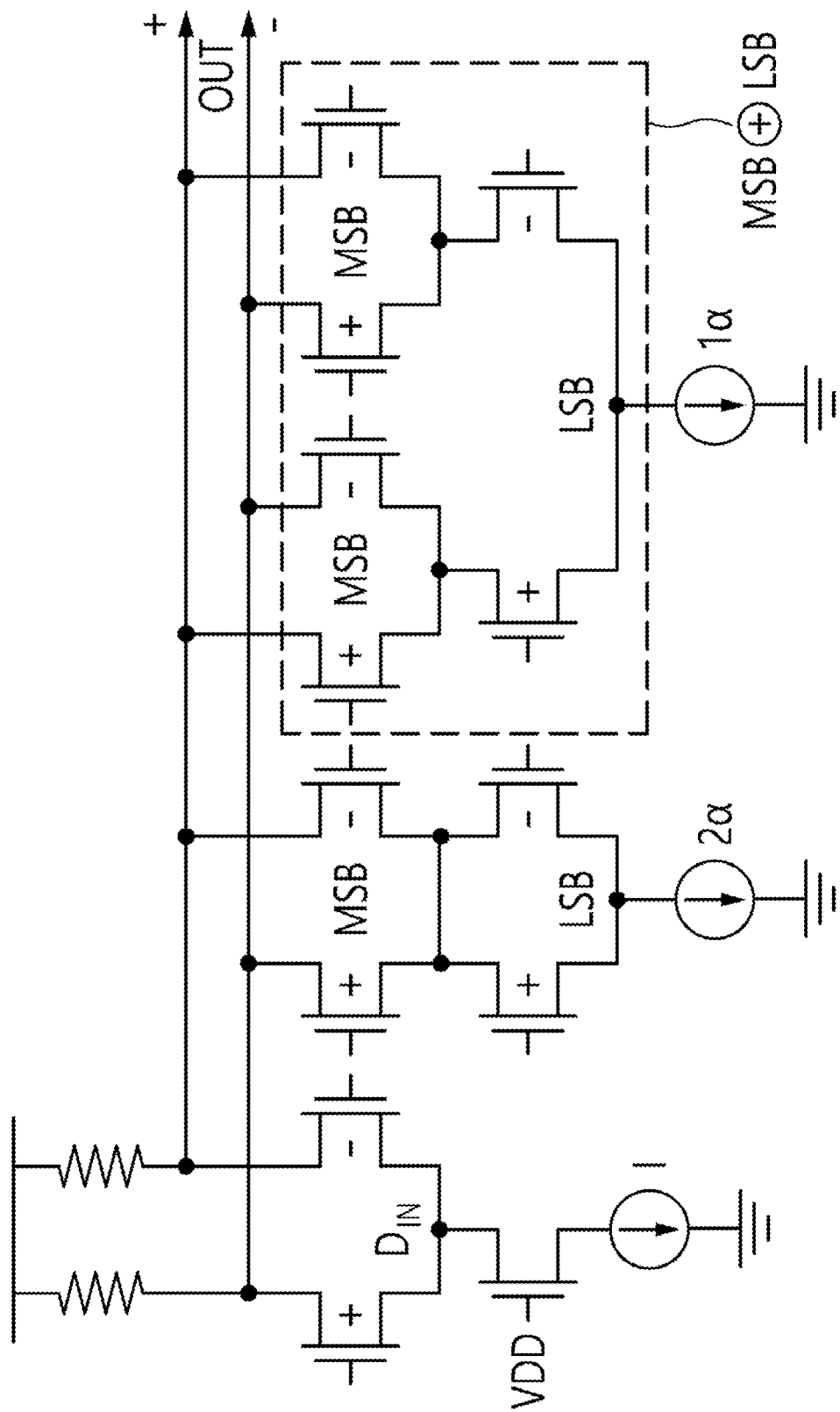
FIG. 10 is a diagram showing the internal circuit configuration of the summer of the DFE applied to the PAM-4 signal receiver according to an embodiment of the present invention.

FIG. 10 is a diagram showing the internal circuit configuration of the summer of the DFE applied to the PAM-4 signal receiver according to an embodiment of the present invention.

Referring to FIG. 10, the summer of the DFE includes one tap that corrects the weight of $2\alpha$ by the MSB signal among the signals outputted from the PAM-4 signal receiver, and two taps that each correct the weight of $1\alpha$ by the LSB signal and the weight of $1\alpha$ by the MSB XOR LSB signal. The two taps that each correct the weight of $1\alpha$ determine whether to add or subtract the weight of $1\alpha$ to/from $2\alpha$ by the LSB signal.

The summer of the DFE needs a smaller weight and therefore, when the LSB signal is 1, the tap weight of $1\alpha$ is applied by subtracting the weight of $1\alpha$ from $2\alpha$, and when the LSB signal is 0, a tap weight of $3\alpha$ is applied by adding the $1\alpha$ weight to $2\alpha$ a tap weight of $3\alpha$.

Additionally, a stack is added to select the LSB signal, wherein a dummy stack is added to ensure the linearity of operation by keeping the stack of all taps constant and to match the load of the MSB and LSB passes. In other words, by adding a dummy stack to the $2\alpha$ pass of the MSB, $V_{ds}$ is maintained at a similar level to match the linearity, and the loads of the LSB pass and MSB pass are matched.

Table 1 below shows the weight of a typical summer, the weight of the proposed summer and the total tap weight applied in the proposed summer, depending on the bit value for the voltage value.

TABLE 1

| Voltage value | Typical summer | | | Proposed summmer | | | Total tap weight |
|---|---|---|---|---|---|---|---|
| | LOW | MID | HIGH | MSB | LSB | MSB XOR LSB | |
| 3 | 1(−1α) | 1(−1α) | 1(−1α) | 1(−2α) | 0(−1α) | 1(−1α) | −3α |
| 1 | 1(−1α) | 1(−1α) | 0(1α) | 1(−2α) | 1(1α) | 0(1α) | −1α |
| −1 | 1(−1α) | 0(1α) | 0(1α) | 0(2α) | 1(−1α) | 1(−1α) | 1α |
| −3 | 0(1α) | 0(1α) | 0(1α) | 0(2α) | 0(1α) | 0(1α) | 3α |

As shown in Table 1, for PAM-4 signals, the amount of feedback information must vary depending on the voltage value (or voltage level). That is, larger voltage level has larger ISI, and therefore, voltage level 3/−3 should have a tap weight three times that of voltage level 1/−1.

Figure 11:
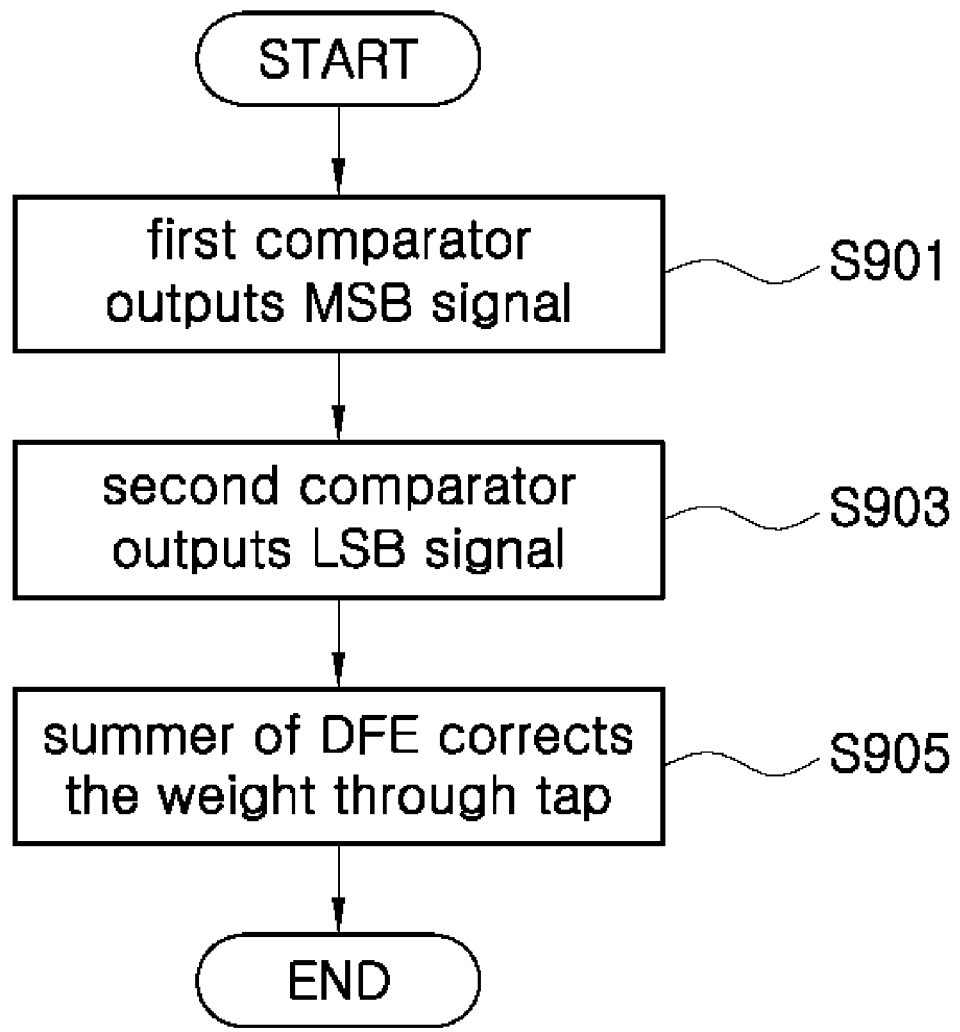
FIG. 11 is a flowchart showing the operation of the PAM-4 signal receiver according to an embodiment of the present invention.

FIG. 11 is a flowchart showing the operation of a PAM-4 signal receiver according to an embodiment of the present invention.

In the PAM-4 signal receiver, a first comparator compares the received PAM-4 signal with a predetermined threshold voltage and outputs an MSB signal (S901), and the second comparator compares the differential signal difference of a positive signal and a negative signal of the received PAM-4 signal with the reference voltage and outputs the LSB signal (S903).

Thereafter, the PAM-4 signal receiver corrects the weight through the DFE summer tap (S905). That is, the DFE summer corrects the weight of $2\alpha$ by the MSB signal using one tap, and corrects, using the two taps, each of the weight of $1\alpha$ by the LSB signal and the weight of $1\alpha$ by the signal having an exclusive OR operation applied to the MSB signal and the LSB signal.

The PAM-4 signal reception method proposed in the present invention can be implemented in the form of program instructions that can be executed through various computer components and recorded on a computer-readable recording medium. The computer-readable recording medium may include program instructions, data files, data structures, etc. singly or in combination.

The program instructions recorded on the computer-readable recording medium may be specially designed and configured for the present invention, or may be known and usable by those skilled in the computer software field.

Examples of the computer-readable recording medium may include a magnetic medium such as hard disks, floppy disks and magnetic tapes, an optical recording medium such as CD-ROMs and DVDs, a magneto-optical medium such as floptical disks, and hardware devices such as ROM, RAM, flash memory, etc. specifically configured to store and execute program instructions.

Examples of program instructions may include not only machine language code such as that created by a compiler, but also high-level language code that can be executed by a computer using an interpreter or the like. The hardware device may be configured to operate as one or more software modules to perform processing according to the present invention and vice versa.

Although various embodiments of the present invention have been shown and described above, the present invention is not limited to the specific embodiments described above, and may be used in the technical field to which the invention pertains without departing from the gist of the invention as claimed in the claims. Of course, various modifications can be made by those skilled in the art, and these modifications should not be understood individually from the technical idea or perspective of the present invention.

The invention claimed is:

1. A device for receiving a four-level pulse amplitude modulation (PAM-4) signal, comprising:
   a first comparator for comparing the received PAM-4 signal with a threshold voltage to output a most significant bit (MSB) signal; and
   a second comparator for comparing a differential signal difference between a positive signal and a negative signal of the received PAM-4 signal with a reference voltage to output a least significant bit (LSB) signal.

2. The device according to claim 1, further comprising a summer of a decision feedback equalizer (DFE) including one tap that corrects a weight of $2\alpha$ by the MSB signal and two taps which respectively correct a weight of $1\alpha$ by the LSB signal and another weight of $1\alpha$ by a signal to which an exclusive OR operation of the MSB signal and the LSB signal has been applied,
   wherein the summer applies a tap weight of $1\alpha$ when the LSB signal is '1', and applies a tap weight of $3\alpha$ when the LSB signal is '0', and
   wherein $\alpha$ is an arbitrary positive integer proportional to a size of an inter-symbol interference (ISI) generated in the LSB signal.

3. The device according to claim 1, wherein the second comparator outputs '1' when the differential signal difference is less than the reference voltage, and outputs '0' when the differential signal difference is greater than the reference voltage.

4. The device according to claim 1, wherein the second comparator includes a first comparison circuit that outputs a value of the differential signal difference and a second comparison circuit that outputs the reference voltage, and wherein each of the first and the second comparison circuits comprises a resistor, first two transistors connected in series to the resistor, and second two transistors connected in parallel to the first two transistors.

5. The device according to claim 4, wherein the first and the second transistors can be replaced with an equivalent resistance, and the second comparator outputs '0' when a value of the equivalent resistance of the first comparison circuit is greater than a value of the equivalent resistance value of the second comparison circuit and outputs '1' when the value of the equivalent resistance of the first comparison circuit is less than the value of the equivalent resistance value of the second comparison circuit.

6. The device according to claim 1, wherein the reference voltage is derived from a difference between a common mode voltage and a first threshold voltage or a difference between a third threshold voltage and the common mode voltage.

7. A method of receiving a four-level pulse amplitude modulation (PAM-4) signal, comprising the steps of:
   comparing, by a first comparator, the received PAM-4 signal with a threshold voltage to output a most significant bit (MSB) signal; and
   comparing, by a second comparator, a differential signal difference between a positive signal and a negative signal of the received PAM-4 signal with a reference voltage to output a least significant bit (LSB) signal.

8. The method according to claim 7, further comprising, after outputting the LSB signal, by a summer of a decision feedback equalizer (DFE), correcting a weight of $2\alpha$ by the MSB signal using one tap, and respectively correcting a weight of $1\alpha$ by the LSB signal and another weight of $1\alpha$ by a signal to which an exclusive OR operation of the MSB signal and the LSB signal has been applied, using two taps,
   wherein the summer applies a tap weight of $1\alpha$ when the LSB signal is '1', and applies a tap weight of $3\alpha$ when the LSB signal is '0', and
   wherein $\alpha$ is an arbitrary positive integer proportional to a size of an inter-symbol interference (ISI) generated in the LSB signal.

9. The method according to claim 7, wherein, in the step of comparing, by the second comparator, the LSB signal outputs '1' when the differential signal difference is less than the reference voltage, and outputs '0' when the differential signal difference is greater than the reference voltage.

10. The method according to claim 7, wherein the second comparator includes a first comparison circuit and a second comparison circuit,
   wherein, in the step of comparing the LSB signal outputs, using the first comparison circuit, a value of the differential signal difference and outputs, using the second comparison circuit, the reference voltage, and wherein each of the first and the second comparison circuits comprises a resistor, first two transistors connected in series to the resistor, and second two transistors connected in parallel to the first two transistors.

11. The method according to claim 10, wherein the first and the second transistors can be replaced with an equivalent resistance, and wherein, in the step of outputting, by the second comparator, the LSB signal outputs '0' when a value of the equivalent resistance of the first comparison circuit is greater than a value of the equivalent resistance of the second comparison circuit and outputs '1' when the value of the equivalent resistance value of the first comparison circuit is less than the value of the equivalent resistance of the second comparison circuit.

12. The method according to claim 7, wherein the reference voltage is derived from a difference between a common mode voltage and a first threshold voltage or a difference between a third threshold voltage and the common mode voltage.

13. A non-transitory recording medium on which a computer program is recorded for performing the method of receiving the PAM-4 signal of claim 7.

* * * * *